United States Patent

Brunemeier et al.

Patent Number: 5,869,401
Date of Patent: Feb. 9, 1999

[54] PLASMA-ENHANCED FLASH PROCESS

[75] Inventors: Paul E. Brunemeier, Sunnyvale; Thomas Miu, Fremont, both of Calif.

[73] Assignee: Lam Research Corporation, Fremont, Calif.

[21] Appl. No.: 780,099

[22] Filed: Dec. 20, 1996

[51] Int. Cl.⁶ .................................................. H01L 21/00
[52] U.S. Cl. .......................... 438/710; 134/1.1; 134/1.2
[58] Field of Search ................. 134/1.1, 1.2; 156/345; 438/905, 710

[56] References Cited

U.S. PATENT DOCUMENTS

| | | | |
|---|---|---|---|
| 5,681,424 | 10/1997 | Saito et al. | 156/643.1 |
| 5,685,916 | 11/1997 | Ye et al. | 134/1.1 |
| 5,700,327 | 12/1997 | Babacz et al. | 134/1.1 |

*Primary Examiner*—R. Bruce Breneman
*Assistant Examiner*—Luz Alejandro
*Attorney, Agent, or Firm*—Beyer & Weaver, LLP

[57] ABSTRACT

A method in a plasma processing chamber, the chamber being employed for processing a substrate, for removing corrosive species from the plasma processing chamber after the substrate is processed. The method includes introducing a flash source gas comprising an oxidizing agent such as oxygen into the plasma processing chamber. The method further includes performing, a flash process, including striking a plasma in the plasma processing chamber with the flash source gas, thereby permitting oxygen species in the plasma to reduce a concentration of the corrosive species in the plasma processing chamber.

23 Claims, 5 Drawing Sheets

|  | Chamber Pressure (mT) | TCP Power (Watts) | Bias Power (Watts) | N₂ Flow (sccm) | He Flow (sccm) | O₂ Flow (sccm) | Helium Pressure (mT) | Temp. (°C) | Duration (seconds) |
|---|---|---|---|---|---|---|---|---|---|
| Exemplar Purge Step Parameters | 15 | 0 | 0 | 200 | 200 | 100 | 0 | Process Temp. | 5 |
| Exemplar Flash Step Parameters | 15 | 300 | 0 | 0 | 0 | 100 | 0 | Process Temp. | 5 |

Fig. 4

PLASMA-ENHANCED FLASH PROCESS

BACKGROUND OF THE INVENTION

The present invention relates to the processing of substrates. More particularly, the present invention relates to improved techniques for liberating corrosive species from the chamber walls of a plasma processing chamber and/or the substrate surface. The present invention also relates to improved techniques for weakening the layers of polymer that are formed above a substrate during plasma processing to facilitate ease of removal.

In the manufacture of semiconductor devices such as integrated circuits and/or flat panel displays from substrates, particularly when plasma-enhanced processing techniques are employed, corrosive etchants may be employed to etch through one or more layers of the layer stack of the substrate. For example, a corrosive etchant may be employed to etch a desired pattern through the metallization layer of the layer stack. As is known, the metallization layer is typically employed to electrically couple device components together. If the metallization layer comprises aluminum, for example, the etchant gas employed may represent, in one example, chlorine or bromine.

For ease of discussion, the remainder of the discussion will be made with reference to the etching of an aluminum metallization layer using corrosive etchants containing chlorine and/or bromine. It should be understood, however, that the inventive techniques herein address the problems caused by any corrosive etchant (whether or not chlorine and/or bromine and whether or not employed to etch through an aluminum layer, or even a metallization layer).

Although corrosive species such as chlorine and/or bromine are efficient at etching the aluminum metallization layer, there are adverse side effects associated with their use. For example, even after the plasma etching step that employs the chlorine and/or bromine species is terminated, some of the chlorine and/or bromine species may be adsorbed onto layers of the layer stack itself. The presence of adsorbed corrosive species, e.g., chlorine and/or bromine, on the layer stack may introduce undesirable contamination into subsequent process steps.

Further, the continued presence of adsorbed chlorine and/or bromine on parts of the metal layer, e.g., the metal features' side walls, may cause the metal features to continue to corrode long after the fabrication process is finished. The continued corrosion of the metal features may eventually damage these metal features, causing the resultant semiconductor device to prematurely fail.

Additionally, it has been observed that chlorine and/or bromine species may become adsorbed onto the chamber walls of the plasma processing chamber. The presence of accumulated chlorine and/or bromine species in the chamber may contaminate other process steps. For example, particles containing chlorine and/or bromine may flake off the chamber wall and contaminate the environment within the plasma processing chamber, which may in turn contaminate the substrate undergoing processing.

The adsorbed chlorine and/or bromine species may react with moisture within the plasma processing chamber to form corrosive acids, which may migrate to other parts of the plasma processing system. These corrosive acids may lodge themselves in various parts of the plasma processing system, contributing to the contamination problem. Over time, the corrosive acids may damage or even destroy parts of the plasma processing system, particularly parts which are susceptible to corrosion such as those containing iron.

In view of the foregoing, there are desired efficient and effective techniques for removing adsorbed corrosive species from the chamber wall of a plasma processing chamber and/or the substrate.

SUMMARY OF THE INVENTION

The invention relates, in one embodiment, to a method in a plasma processing chamber, the chamber being employed for processing a substrate, for removing corrosive species from the plasma processing chamber after the substrate is processed. The method includes introducing a flash source gas into the plasma processing chamber. The flash source gas comprising an oxidizing agent. The method further includes performing a flash process, including striking a plasma in the plasma processing chamber with the flash source gas, thereby permitting oxygen species in the plasma to reduce a concentration of the corrosive species in the plasma processing chamber.

In another embodiment, the invention relates to a method for removing corrosive species from a substrate surface. The substrate has been processed in accordance with conventional plasma processing steps in a plasma processing chamber. The method includes introducing a flash source gas comprising an oxidizing agent into the plasma processing chamber. The method further includes sustaining a plasma with the flash source gas in the plasma processing chamber, thereby forming oxygen species above the substrate to permit the oxygen species in the plasma to reduce a concentration of corrosive species from the substrate surface.

In yet another embodiment, the invention relates to a method for weakening polymer deposition above a substrate surface. The substrate has been processed in accordance with conventional plasma processing steps in a plasma processing chamber. The method includes introducing a flash source gas comprising an oxidizing agent into the plasma processing chamber. The method further includes sustaining a plasma with the flash source gas in the plasma processing chamber, thereby forming oxygen species above the substrate to permit the oxygen species in the plasma to interact with the polymer deposition to weaken the polymer deposition.

These and other advantages of the present invention will become apparent upon reading the following detailed descriptions and studying the various figures of the drawings.

BRIEF DESCRIPTION OF THE DRAWINGS

To simplify discussion of the details and advantages of the present invention,

FIG. 4 illustrates, in one example, exemplar parameters of the inventive plasma-enhanced flash step, including exemplar parameters of a preceding purge step.

DETAILED DESCRIPTION OF THE PREFERRED EMBODIMENTS

Figure 1:
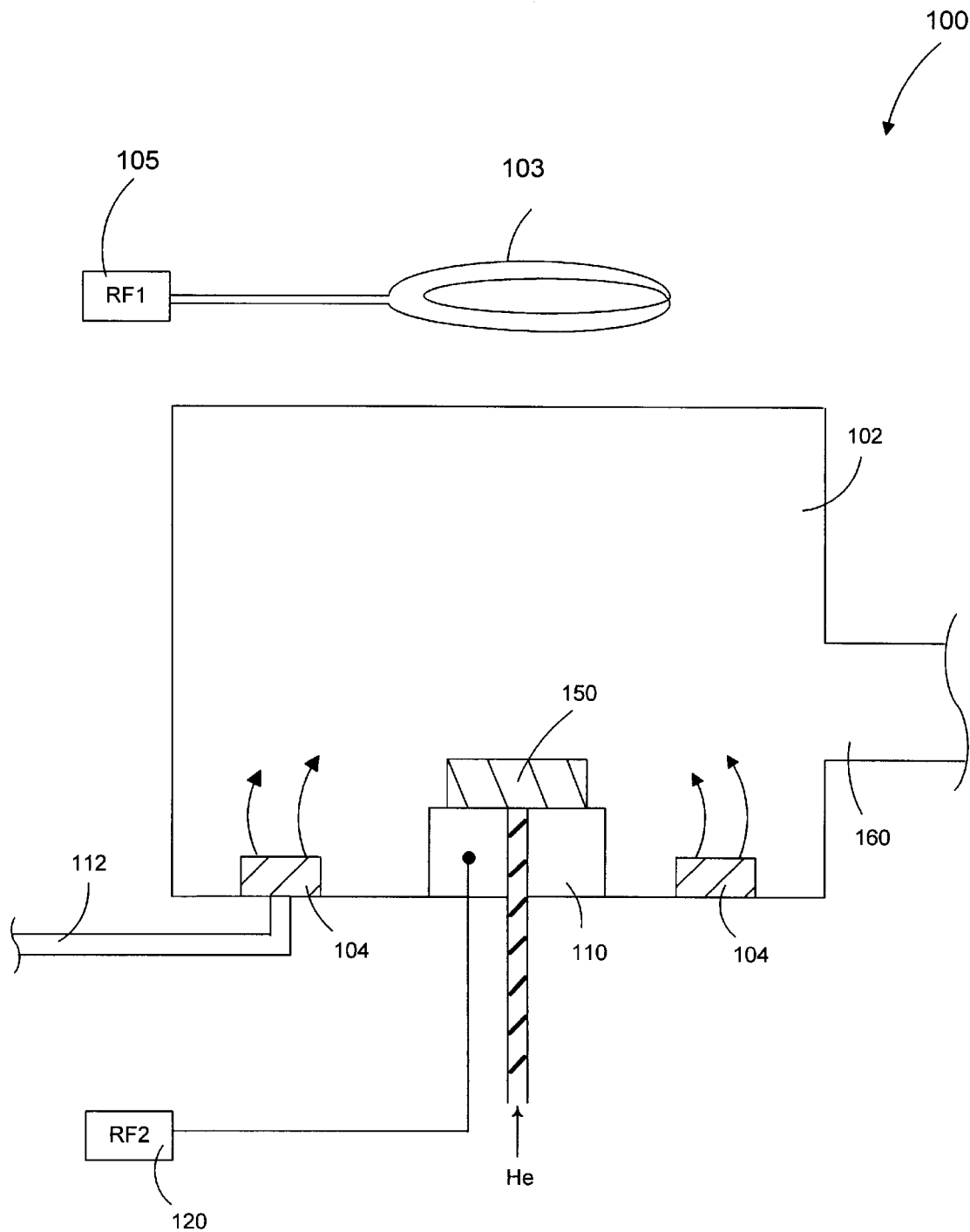
FIG. 1 illustrates a simplified schematic of a TCP® 9400 plasma reactor, representing a plasma processing system suitable for use with the present invention.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the present invention, there is provided a plasma-enhanced flash process which is conducted within the plasma processing chamber after the conventional substrate processing steps have been completed. The plasma-enhanced flash process of the present invention advantageously displaces the adsorbed corrosive species from the walls of the chamber, thereby allowing them to be exhausted from the chamber. As a consequence, there is reduced migration of corrosive species within the plasma processing system, and hence, corrosion.

If the plasma-enhanced flash process is performed with the substrate in the chamber, corrosive species adsorbed in the layers of the substrate are also advantageously displaced, thereby allowing the displaced corrosive species to be exhausted out of the chamber. As a consequence, the potentiality of contamination due to the presence of adsorbed corrosive species on the surface of the substrate is substantially reduced. Furthermore, the absence of adsorbed corrosive species alleviates the aforementioned metal line corrosion problem, which is caused in part by the accumulation of adsorbed corrosive species left behind on the metal walls after processing, and which may lead to premature device failure.

The plasma-enhanced flash step also assists in the removal of the layers of polymers that are typically formed on the surface of the substrate during plasma processing. The removal of these polymers, as is well known, presents a significant challenge in the current art since it is difficult to satisfactorily remove the polymers without adversely affecting the formed components, for example the delicate gate oxide of metal oxide semiconductor (MOS) transistor devices. The plasma-enhanced flash process of the present invention, which is performed after conventional substrate processing is completed, advantageously weakens the polymers to facilitate their removal. More importantly, it is believed that the inventive plasma-enhanced flash step weakens the polymers without concomitantly damaging the formed components on the wafer.

In accordance with one aspect of the present invention, the aforementioned plasma-enhanced flash technique may be performed in any of the known plasma processing apparatuses, including those adapted for dry etching, plasma etching, reactive ion etching (RIE), magnetically enhanced reactive ion etching (MERIE, electron cyclotron resonance (ECR), or the like. To further elaborate, in a typical plasma processing chamber adapted for dry etching, the substrate is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the substrate layer stack. The by-products, which may be volatile, are then exhausted through an exit port.

Plasma etching relates to the situation where the substrate is positioned on the anode, or ground electrode during substrate processing. On the other hand, reactive ion etching (RIE) relates to the situation where the substrate is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma (planar and/or nonplanar). ECR and TCP™-brand processing systems, among others, are readily available commercially. TCP™-brand systems are available from, for example, Lam Research Corporation of Fremont, Calif.

In a preferred embodiment, the present invention is employed in a TCP™ 9400 plasma reactor, which is available from Lam Research Corporation, although, as mentioned above, any conventional and suitable plasma processing systems may well be employed. To facilitate discussion of the details and advantages of the present invention, FIG. 1 illustrates a simplified schematic of a TCP™ 9400 plasma reactor, representing a plasma processing system suitable for use with the present inventive technique. Plasma reactor 100 includes a plasma processing chamber 102. Above chamber 102, there is disposed an electrode 103, which is implemented by a coil in the example of FIG. 1. Coil 103 is energized by a RF generator 105 via a matching network (not shown in FIG. 1).

Within chamber 102, there is provided a gas ring 104, which preferably includes a plurality of holes for releasing gaseous source materials, e.g., the source gases employed for etching, purging, flash, or the like, into the region above substrate 150 within chamber 102. The gaseous source materials may also be released, in some systems, from ports built into the walls of the chamber itself or from a shower head apparatus, if desired.

Substrate 150 is introduced into chamber 102 and disposed on a chuck 110 for processing, which acts as a bias electrode and is preferably biased by a radio frequency generator 120 (also typically via a matching network). Helium cooling gas may be introduced under pressure (e.g., about 5–10 Torr in one embodiment) between chuck 110 and substrate 150 to act as a heat transfer medium for accurately controlling the substrate's temperature during processing to ensure uniform and repeatable etching results. During plasma etching, the pressure within chamber 102 may be kept low by withdrawing gas through port 160, e.g., a high conductance manifold.

Figure 2:
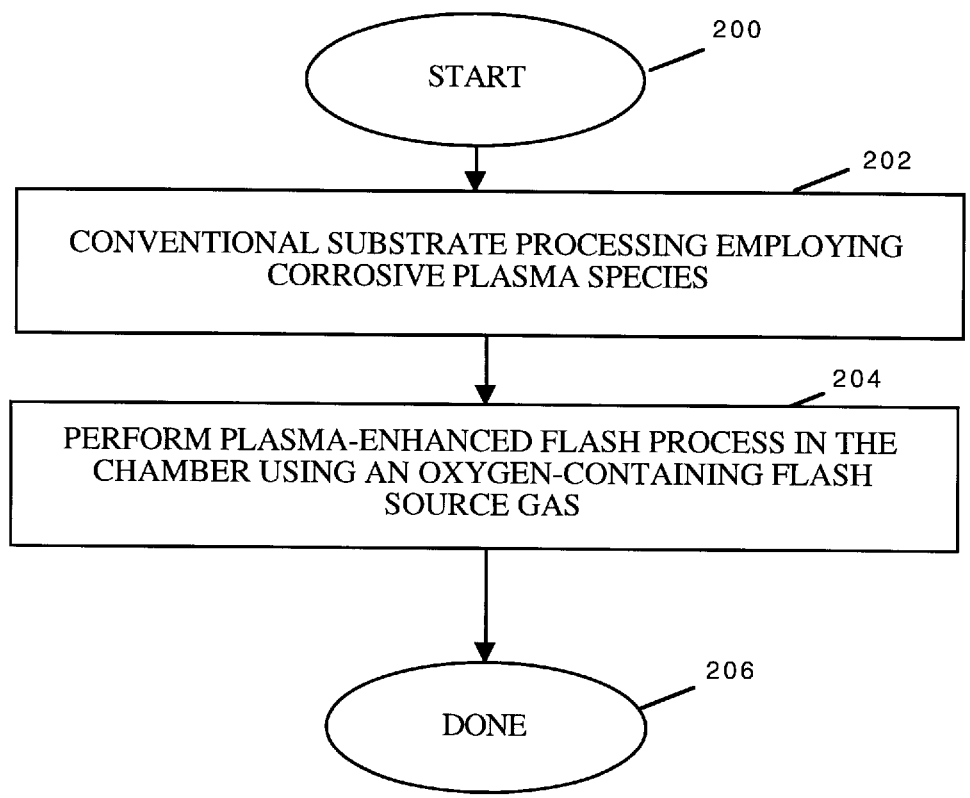
FIG. 2 illustrates, in accordance with another embodiment of the present invention, the steps for removing corrosive species.

In accordance with one aspect of the present invention, there is provided after conventional substrate processing, e.g., the desired steps of etching, deposition, or the like, an additional plasma-enhanced flash process. FIG. 2 illustrates, in accordance with one embodiment of the present invention, the steps of the plasma-enhanced flash process. In step 202, the substrate is processed as conventional employing one or more corrosive plasma species. In the example furnished earlier, the aluminum metallization layer of the substrate is etched using an etchant source gas that contains chlorine and/or bromine such as $Cl_2$, HBr, HCl, $BCl_3$, $CCl_4$ as well as other suitable etchants known to those skilled.

When the plasma is struck within the plasma processing chamber, some of the corrosive species, e.g., chlorine or bromine species, may become adsorbed onto the walls of chamber 102 and/or any surface exposed to the plasma, e.g., the surfaces of the gas ring, the inner walls of exhaust port 160, or within conduit line 112, which feeds the source gas from a reservoir (not shown in FIG. 1) to gas ring 104.

If not removed, some of the adsorbed corrosive species may cause severe corrosion problems to parts of plasma processing chamber 100, particularly parts which contain iron such as the gas feedthroughs. Additionally or alternatively, the adsorbed corrosive species may also cause damage to iron-containing parts of the system, e.g., load locks. While not wishing to be bound by theory, it is believed that the corrosive species, e.g., chlorine species or bromine species, react with ambient moisture within chamber 102 or with the thin layer(s) of water on the inner surfaces of chamber 102 to form corrosive acids, e.g., HCl or HBr. The moisture is introduced into chamber 102 when, for example, the chamber is opened to allow substrate 150 to be removed therefrom or placed on chuck 110 for processing. The formation of the corrosive acids may be significantly enhanced by the plasma process since the species may be, as is generally known, more reactive than chlorine in a non-plasma form. Over time, the corrosive acids may migrate to parts of the plasma processing system, even those never exposed to the plasma environment itself, where it causes corrosion damage.

After conventional processing steps are completed, a plasma-enhanced flash process is run in the plasma processing chamber, in step 204, to reduce the concentration of the corrosive species in the chamber. The plasma-enhanced flash process involves igniting a plasma while an oxygen-containing flash source gas is present within the plasma processing chamber. The plasma-enhanced flash process is permitted to continue, in one embodiment, until the concentration of the corrosive species within the chamber and/or on the substrate surface is reduced to a predefined level.

While not wishing to be bound by theory, it is believed that oxygen radicals, which are formed when a plasma is struck with an oxygen-containing flash source gas within the plasma processing chamber during the plasma-enhanced flash process, advantageously displaces the corrosive acids, which are formed with the corrosive species during the preceding conventional substrate processing steps, from their bonding sites on the inner surfaces of the plasma processing chamber. When the acid molecules are displaced, they can be pumped away via the exhaust port of the chamber.

In a particularly advantageous embodiment of the present invention, no additional time is required to perform the plasma-enhanced flash process of the present invention. It is observed that after every substrate is processed, there is typically required a dechucking step wherein the plasma source gases and power to the electrodes of the plasma processing chamber are turned off for a given period of time, e.g., 10 seconds, to relieve the clamping force that holds the substrate on the chuck. Dechucking is a well known step and is not described in detail here.

In one embodiment, the invention takes advantage of the existence of the required dechucking time to perform at least a portion or even the entire duration of the inventive plasma-enhanced flash process concurrent therewith. When so performed, the invention advantageously requires little, if any, additional processing time since the corrosive species removal via the inventive flash process is performed concurrent with the process of relieving the clamping force that holds the substrate on the chuck, i.e., dechucking. By way of example, it is possible, to employ only five seconds of the ten-second dechuck time to perform the corrosive species removal in accordance with the inventive plasma-enhanced flash process.

To further facilitate efficient removal of adsorbed corrosive species, there is further provided, in one particularly advantageous embodiment, a purge step prior to the plasma-enhanced flash step. Purging advantageously removes a large portion of the corrosive species from the chamber by pumping a relatively large volume of a non-corrosive purge gas through the chamber to physically displace as much of the corrosive species and molecules as possible. Purging is particularly useful in removing any residual corrosive source gas from the conduit lines of the plasma processing chamber, e.g., conduit line 112 of FIG. 1. The purging gas may represent, in one embodiment, any non-corrosive gas such as any of the non-chlorine containing, non-bromine containing, relatively inert, or any other gas that does not corrode and/or produce corrosive species during the subsequent plasma step of the plasma-enhanced flash process.

Figure 3:
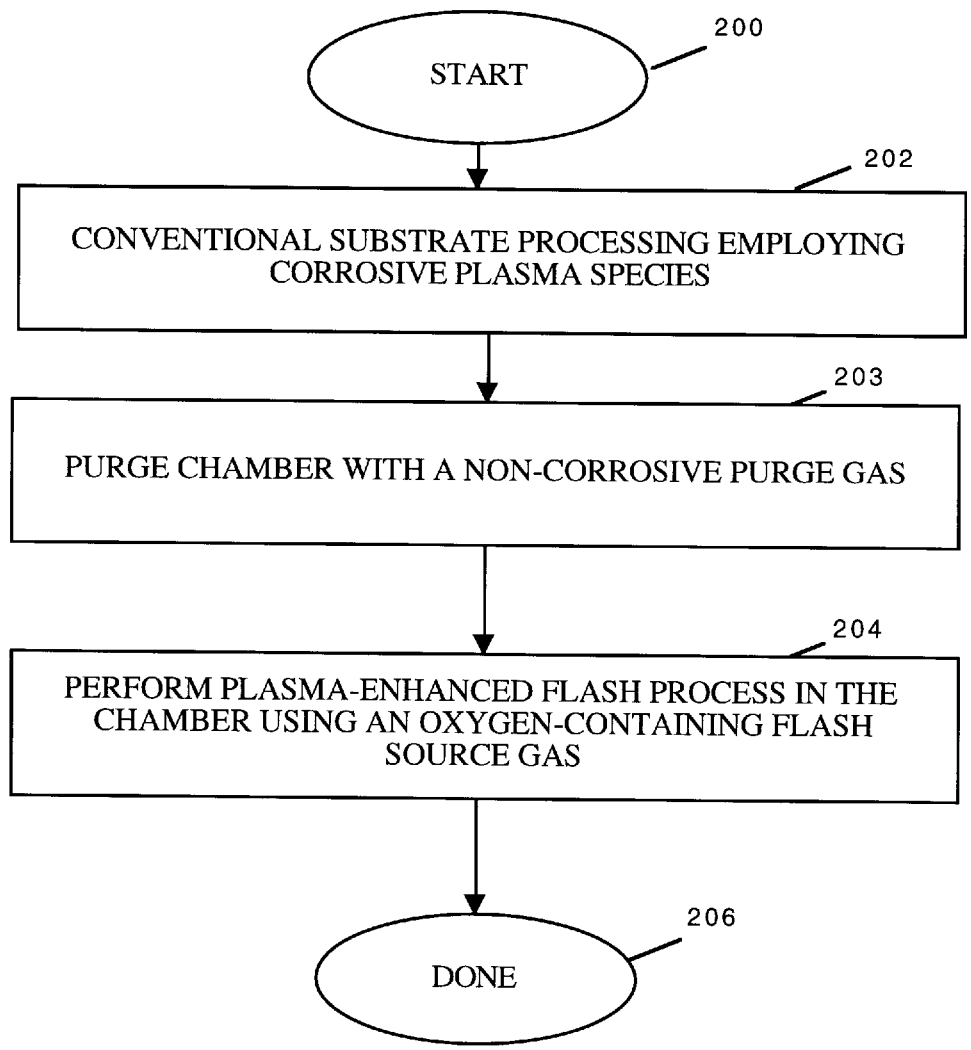
FIG. 3 illustrates, in accordance with another embodiment of the present invention, the steps for removing corrosive species of FIG. 2, including a purge step.

Purging, if done with the flash source gas, e.g., the oxygen-containing gas employed to strike the plasma during the plasma-enhanced flash step, has the further advantage of stabilizing the flash source gas in the chamber prior to the plasma-enhanced flash step. Accordingly, when the power is turned on to strike the plasma in the subsequent plasma-enhanced flash step, little or no time is lost in the plasma-enhanced flash step waiting for the flash source gas to stabilize. FIG. 3 illustrates this embodiment wherein an additional purge step 203 is performed prior to performing the plasma-enhanced flash process 204 (described earlier in connection with FIG. 2).

In one embodiment, the invention takes advantage of the existence of the required dechucking time to also perform the purge step concurrent therewith. When so performed, the invention advantageously requires little, if any, additional processing time since a portion or even the entire duration of the purge step may be performed during dechucking. In one example, the purge step only requires five seconds of the ten-second dechuck time to physically purge and pump away the remaining chlorine-containing gases from the conduit lines and interior of the chamber.

In one particularly advantageous embodiment, a substantial portion or the entire duration of the time required for both purge step 203 and plasma-enhanced flash step 204 are concurrent with the time required for dechucking. In the above example, both the five-second purge step and the five-second plasma-enhanced flash step may be performed concurrent with the ten-second dechuck step. In this embodiment, little or no additional time is required to derive the advantages offered by the present invention, e.g., reduction in the concentration of the corrosive species in the chamber and conduit lines leading thereto. Accordingly, there is no adverse impact on the wafer cycle time, the throughput of the plasma processing system, and/or to its cost of ownership.

In one embodiment, other conventional cleaning steps may be introduced between purge step 203 and plasma-enhanced flash step 204 to further enhance the removal of the corrosive species. For example, the chamber may be evacuated following the purge step and before the commencement of plasma-enhanced flash step 204. As another example, a pump-purge step may be performed between purge step 203 and plasma-enhanced flash step 204. In a pump-purge step, the chamber and/or the conduit lines leading thereto may be filled with some non-corrosive gas and pumped out, possibly more than once, to more thoroughly remove the corrosive species prior to the plasma-enhanced flash step.

In one embodiment, the wafer may be removed from the chamber so that the plasma-enhanced flash step and/or purge step may be optimized, in term of the gases employed, the duration, and/or other parameters, for maximum corrosive species removal without concern for damage to the substrate (particularly to the fragile features thereon). This is particularly useful if there is a risk of damage or contamination to the substrate if subject to the additional plasma-enhanced flash step and/or purge step. Wafer removal may be performed either before the purge step or in between the purge step and the plasma-enhanced flash step.

The plasma-enhanced flash step and/or purge step also have other advantages. When one or both of these steps are performed on the substrate, corrosive species (such as the aforementioned chlorine- or bromine-containing species) may advantageously be liberated from the substrate surface to be pumped away. As can be appreciated by those skilled, the removal of these corrosive species from the substrate surface advantageously reduces the risk of contamination in subsequent process steps. Additionally, the removal of corrosive species from the metal side walls also advantageously alleviates the aforementioned metal line corrosion problem, which has been heretofore one of the main causes of premature device failures. Of course the plasma-enhanced flash step may be performed on each substrate if these substrate-related advantages are desired and/or optimal cleaning of the chamber is desired.

Note that by performing the plasma-enhanced flash step as a separate step after conventional substrate processing is completed, the present invention permits, in one embodiment, more efficient removal of adsorbed corrosive species from the substrate surface and/or from the chamber walls. If the oxygen radicals are formed as part of a conventional processing step, e.g., an etching step that employs a corrosive etchant, some of the oxygen radicals may be taken up by the more abundant corrosive species within the chamber interior, leaving less oxygen radicals to attack the adsorbed corrosive species on the chamber inner walls and/or on the substrate surface. Additionally, if the oxygen plasma is terminated at the same time as the termination of the conventional processing step (e.g., not allowed to continue on its own as a separate step after the termination of conventional processing), the action of the oxygen radicals is not employed to bring the concentration of the corrosive species down below the level existing during conventional substrate processing. As such, a higher concentration of corrosive species may exist on the chamber inner walls and/or the substrate surface.

It is also found that, in some cases, exposure to oxygen radicals causes the polymers that are formed on substrate surface to be more efficiently removed. The efficient removal of these deposited polymers advantageously addresses the yield loss problem associated with prior art techniques of polymer removal. To elaborate, polymers that are deposited during conventional substrate processing needs to be removed, as is well known to those skilled. Typically the removal of these polymers is performed in a wet dip process, wherein the dip solution attacks the deposited polymers and strips it from the substrate surface.

It is found, however, that the wet dip process, as well as some other polymer removal processes, also attacks some of the delicate features on the substrate, such as the thin gate oxide feature (which typically comprises silicon dioxide). If the substrate must be exposed to the polymer removal process for a long period of time to adequately remove the deposited polymers, unwanted damage to the features may occur. The damage translates to yield loss, which increases the cost of the resultant devices.

While not wishing to be bound by theory, it is believed that the oxygen radicals in the plasma-enhanced flash step dislodge the bonds in the carbon-containing polymers, thereby weakening the polymers and rendering them more susceptible to subsequent removal. It is also believed that oxygen radicals do not readily attack the fully oxidized features, such as the aforementioned gate oxide. Accordingly, the inventive plasma-enhanced flash step, which in this application is performed either as a step concurrent with a conventional processing step, e.g., etching, or as a separate, post-conventional processing step in one embodiment, advantageously weakens the polymers for removal without impacting the formed features. In one embodiment, it is found that the use of the plasma-enhanced flash step advantageously shortens the time required to remove the polymers in a subsequent wet dip step by one-half, or even one-third, of the time typically required in the prior art.

Of course the substrates may be removed from the chamber where conventional substrate processing took place and placed in another chamber for the plasma-enhanced flash step. This may be useful, for example, when it is desirable to optimize the plasma-enhanced flash step and/or purge step specifically to weaken the deposited polymer on the chamber or to liberate adsorbed corrosive species from the substrate surface, or a combination thereof This may also be useful if it is desired to subject the chamber employed for conventional substrate processing to a plasma-enhanced flash step that is optimized for removal of adsorbed corrosive species from the chamber inner walls, particularly if such a plasma-enhanced flash step is conducted with parameters which may cause damage to the substrate.

FIG. 4 illustrates, in one example, exemplar parameters of the inventive technique wherein both purge step 203 and plasma-enhanced flash step 204 of FIG. 3 are performed in a TCP™ 9400 plasma processing chamber. The substrate remains on the chuck after a conventional plasma etching step employing $Cl_2$ and $BCl_3$ was performed on the metal layer of the substrate. During the purge step, a high flow purge is performed with 500 standard cubic centimeter per minute (sccm) of purge gas through the chamber. The purge gas includes 200 sccm of $N_2$, 200 sccm of He, and 100 sccm of $O_2$. However, the respective ratio of the components of the purge gas is not critical, nor is its flow. It is preferred that some non-corrosive gas (e.g., $N_2$, He, Ar, $O_2$, or any other relatively non-reactive gas) be flowed for a sufficient time to adequately flush the conduit lines and/or the chamber. In one embodiment five seconds works well.

Pressure is kept at about 15 milliTorr (mT) within the chamber during the purge step in one embodiment. Since the purging step is performed simultaneous with dechucking in this example, power to both the TCP™ coil and the bottom electrode is at about zero. Note that oxygen is flowed during this purge step to stabilize the oxygen flow prior to the plasma-enhanced flash step (as discussed earlier). It should be emphasized again that the parameters of the purge step are not critical. As long as the conduit lines and/or chamber are adequately purged with a non-corrosive purge gas, the specific parameters employed and/or the specific purge gases employed are not critical.

During the plasma-enhanced flash step, pressure within the chamber may range from about 0.01 mT to about 1,000 mT, more preferably from about 1 mT to about 100 mT, and preferably at about 15 mT. It is believed that lower pressures tend to improve diffusion of the oxygen radicals, which may enhance their effectiveness in displacing the corrosive species from the surfaces of the chamber inner walls and/or the substrate surface. Too low a chamber pressure, however, may make it difficult to ignite the plasma reproducibly, consistently, and quickly. The appropriate chamber pressure for a given plasma processing system is therefore dependent on the process parameters, the design of the plasma processing system, and others, in view of these general observations.

Power to the TCP™ coil may range from about 50 W to about 1,000 W. In this example, TCP power is set at 300 W. Power is preferably set at the lowest setting that can reliably and quickly strike a plasma within the chamber. Bias power, i.e., power to the chuck, is set at about 0 W. Although this is not absolutely necessary, it is generally preferable to minimize the bias power to minimize the amount of bombardment the substrate is subjected to during the plasma-enhanced flash step. Oxygen flow may range from about 1 sccm to about 1,000 sccm. In this example, oxygen flow is set at 100 sccm. The oxygen flow, is constrained at its lower limit by the effectiveness with which the corrosive species may be removed and at the upper limit, in part, by the ability of the high conductance exhaust pump to evacuate the chamber.

Cooling helium flow to the wafer backside is again at about 0 T since dechucking is taking place simultaneously in this example. The duration of the plasma-enhanced flash step is at five seconds. The determination of the appropriate duration for the plasma-enhanced flash step is discussed in greater detail in connection with FIG. 5. Note that both the purge step and the plasma-enhanced flash step are conducted with the substrate at process temperature, i.e., the temperature of the earlier conventional wafer processing step(s). Higher temperatures are generally better for displacement reactions. Since it is believed that the oxygen radicals displace the adsorbed corrosive species during the plasma-enhanced flash step, it is also believed (again, not wishing to be bound by theory) that higher temperatures may make the plasma-enhanced flash step more efficient.

Figure 5:
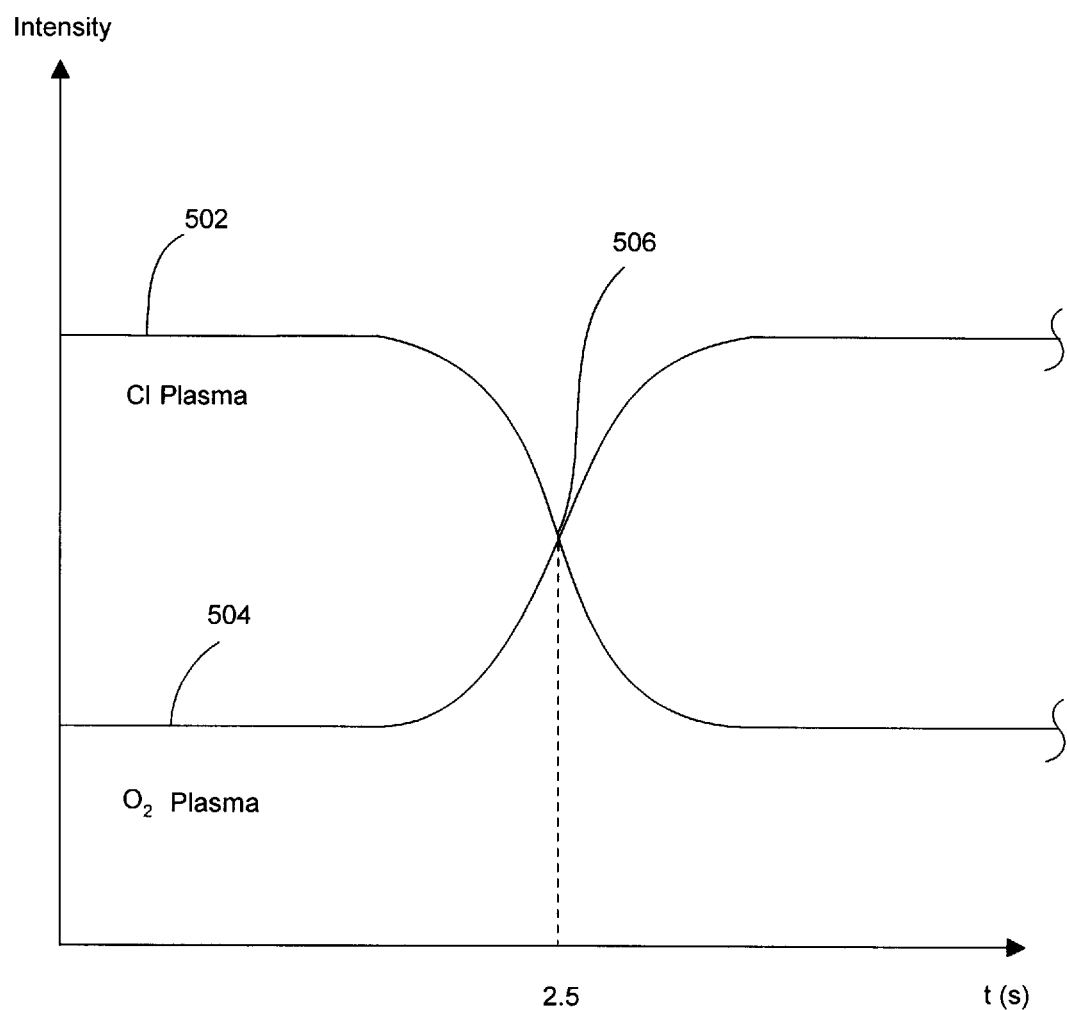
FIG. 5 shows an example of a somewhat idealized optical excitation plot, representing the plot that may be employed, in one embodiment, to ascertain the duration of the plasma-enhanced flash step.

FIG. 5 shows an example of a somewhat idealized optical excitation plot, representing a plot which may be obtained during a plasma-enhanced flash step. As discussed, oxygen radicals are employed to displace corrosive chlorine species from the chamber and/or the substrate surface during the inventive plasma-enhanced flash step. The optical excitation plot is employed, in accordance with one aspect of the present invention, for determining the appropriate duration for the plasma-enhanced flash step.

The plot of FIG. 5 includes two lines: a chlorine plasma line 502 and an oxygen plasma line 504. Chlorine plasma line 502 represents the intensity of the optical emission due to chlorine species in the plasma. Oxygen plasma line 504 represents the intensity of the optical emission due to the oxygen species.

Before transition point 506, the optical emission due to the chlorine species is higher than the optical emission due to the oxygen species. As the flash step proceeds, the concentration of the chlorine species is reduced. After transition point 506, there is less chlorine species, and the optical emission due to the chlorine species is lower than the optical emission due to the oxygen species. Depending on the corrosive species, the configuration of the chamber, and the flash source gas employed, among others, the optical excitation plot may vary widely from machine to machine, or even in the same machine for different processes. Consequently, the time it takes to reach transition point 506 may also vary.

In one embodiment, the duration is preferably, but not required to be, longer than the time it takes to reach transition point 506. In FIG. 5, for example, the duration of the plasma-enhanced flash step is preferably longer than the 2.5 seconds it took to reach transition point 506, e.g., the duration may be around five seconds in one embodiment.

While this invention has been described in terms of several preferred embodiments, there are alterations, permutations, and equivalents which fall within the scope of this invention. For example, although the preferred embodiments are discussed with reference to the removal of adsorbed corrosive species from the reactor chamber walls and/or the substrate surface, the inventive plasma-enhanced technique may be employed to reduce the concentration of corrosive species from the reactor chamber walls and/or the substrate surface, whether or not they are adsorbed. Further, although oxygen is discussed herein as the flash source gas to facilitate ease of understanding, it should be understood that the flash source gas may include any oxidizing agent, e.g., oxygen, ozone, hydrogen peroxide, and other oxidizing agents known to those skilled from which oxygen species may be formed. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a plasma processing chamber, said plasma processing chamber being employed for processing a substrate, a method for removing corrosive species from surfaces within said plasma processing chamber after said substrate is processed, comprising:

extinguishing a process plasma employed to process said substrate;

thereafter, purging said plasma processing chamber with a flash source gas to remove at least some of said corrosive species from within said plasma processing chamber while said substrate is disposed on an electrostatic chuck in said plasma processing chamber, said flash source gas comprising an oxidizing agent, said purging being performed while said substrate is dechucked from said electrostatic chuck and said process plasma is extinguished; and thereafter, performing a flash process including striking a plasma in said plasma processing chamber with said flash source gas, thereby permitting oxygen species in said plasma to reduce a concentration of said corrosive species on said surfaces in said plasma processing chamber, wherein conditions in said plasma processing chamber, including a pressure within said plasma processing chamber, are stabilized by said purging prior to said performing said flash process.

2. The method of claim 1 wherein said electrostatic chuck is couple to a bias power source, said bias power source being off at least during a portion of said performing said flash process.

3. The method of claim 1 wherein said oxidizing agent comprises oxygen.

4. The method of claim 3 wherein said performing said flash process is performed at a chamber pressure of about 0.01 milliTorr to about 1000 milliTorr.

5. The method of claim 4 wherein said performing said flash process is performed at a chamber pressure of about 1 milliTorr to about 100 milliTorr.

6. The method of claim 3 wherein said performing said flash process is performed at a chamber pressure of about 15 milliTorr.

7. The method of claim 3 wherein said plasma is struck with an inductive coil, said inductive coil being supplied with about 50 Watts of power to about 1000 Watts of power during said flash process.

8. The method of claim 3 wherein said plasma is struck with an inductive coil, said inductive coil being supplied with about 300 Watts of power during said flash process.

9. The method of claim 6 wherein said performing said flash process is performed at an oxygen flow of about 1 standard cubic centimeter per minute to about 1000 standard cubic centimeter per minute.

10. The method of claim 6 wherein said performing said flash process is performed at an oxygen flow of about 100 standard cubic centimeter per minute.

11. The method of claim 6 wherein said corrosive species comprise one of chlorine species and bromine species.

12. The method of claim 6 wherein said performing said flash process is terminated after a predefined time period, said predefined time period being longer than a time required to reach a transition point in a plot of an optical excitation line of said corrosive species and an optical excitation line of said oxygen species.

13. The method of claim 3 wherein at least a portion of said corrosive species represents corrosive species adsorbed by interior surfaces of said plasma processing chamber.

14. A method for removing adsorbed corrosive species from a surface of a substrate, said substrate having been processed in accordance with conventional plasma processing steps in a plasma processing chamber, comprising:

extinguishing a process plasma employed to process said substrate;

thereafter, purging said plasma processing chamber with a flash source gas to remove at least some of said corrosive species from said surface of said substrate while said substrate is disposed on an electrostatic chuck in said plasma processing chamber, said flash source gas comprising an oxidizing agent, said purging being performed while said substrate is dechucked from said electrostatic chuck and said process plasma is extinguished; and thereafter striking a plasma with said flash source gas in said plasma processing chamber, thereby forming oxygen species above said substrate to permit said oxygen species in said plasma to reduce a concentration of said adsorbed corrosive species from said surface of said substrate, wherein conditions in said plasma processing chamber, including a pressure within said plasma processing chamber, are stabilized by said purging prior to said performing said flash process.

15. The method of claim 14 wherein said striking said plasma is performed in a plasma processing chamber different from said plasma processing chamber employed for said conventional plasma processing steps.

16. The method of claim 14 wherein said striking said plasma is performed in said plasma processing chamber, said plasma chamber being employed earlier for said conventional plasma processing steps.

17. The method of claim 14 wherein said oxidizing agent comprises oxygen.

18. The method of claim 17 wherein said adsorbed corrosive species represent one of chlorine species and bromine species.

19. The method of claim 18 wherein said striking said plasma is performed while a bias power to a chuck supporting said substrate is at about 0 W.

20. A method for facilitating the removal of polymer deposition above a surface of a substrate, said substrate having been processed in accordance with conventional plasma processing steps in a plasma processing chamber, comprising:

extinguishing a process plasma employed to process said substrate;

thereafter, purging said plasma processing chamber with a flash source gas to remove at least some of said polymer deposition from said surface of said substrate while said substrate is disposed on an electrostatic chuck in said plasma processing chamber, said flash source gas comprising an oxidizing agent, said purging being performed while said substrate is dechucked from said electrostatic chuck and said process plasma is extinguished; and thereafter striking a plasma with said flash source gas in said plasma processing chamber, thereby forming oxygen species above said substrate to permit said oxygen species in said plasma to interact with said polymer deposition, wherein conditions in said plasma processing chamber, including a pressure within said plasma processing chamber, are stabilized by said purging prior to said performing said flash process.

21. The method of claim 20 wherein said striking said plasma is performed in a plasma processing chamber different from said plasma processing chamber employed for said conventional plasma processing steps.

22. The method of claim 20 wherein said striking said plasma is performed in said plasma processing chamber, said plasma chamber being employed earlier for said conventional plasma processing steps.

23. The method of claim 20 wherein said striking said plasma is performed while a bias power to a chuck supporting said substrate is at about 0 W.

* * * * *